(12) United States Patent
Nickel (10) Patent No.: US 10,317,490 B2
(45) Date of Patent: Jun. 11, 2019

(54) METHOD AND MAGNETIC RESONANCE APPARATUS FOR DETERMINING DEPHASING FACTORS IN MR MULTIECHO TECHNIQUES

(71) Applicant: Siemens Healthcare GmbH, Erlangen (DE)

(72) Inventor: Marcel Dominik Nickel, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 179 days.

(21) Appl. No.: 15/262,100

(22) Filed: Sep. 12, 2016

(65) Prior Publication Data

US 2017/0082709 A1 Mar. 23, 2017

(30) Foreign Application Priority Data

Sep. 17, 2015 (DE) .................. 10 2015 217 880

(51) Int. Cl.
*G01V 3/00* (2006.01)
*G01R 33/48* (2006.01)
*G01R 33/385* (2006.01)
*G01R 33/46* (2006.01)
*G01R 33/54* (2006.01)

(52) U.S. Cl.
CPC ....... *G01R 33/4828* (2013.01); *G01R 33/385* (2013.01); *G01R 33/4625* (2013.01); *G01R 33/543* (2013.01); *G01R 33/546* (2013.01)

(58) Field of Classification Search
CPC ............ G01R 33/4816; G01R 33/4818; G01R 33/482; G01R 33/4822; G01R 33/4824; G01R 33/4826; G01R 33/4828; G01R 33/483; G01R 33/4831; G01R 33/4833; G01R 33/4835; G01R 33/4836; G01R 33/4838; G01R 33/387; G01R 33/246; G01R 33/38
USPC .................................................. 324/300–322
See application file for complete search history.

(56) References Cited

U.S. PATENT DOCUMENTS

| 2005/0200356 A1 | 9/2005 | Hennig | |
| 2014/0167755 A1* | 6/2014 | Nickel | G01R 33/4828 324/309 |
| 2015/0061667 A1 | 3/2015 | Nickel | |

(Continued)

OTHER PUBLICATIONS

Berglund et al., "Two-point Dixon Method With Flexible Echo Times", Magnetic Resonance in Medicine, vol. 65, pp. 994-1004, (2011).

(Continued)

*Primary Examiner* — Giovanni Astacio-Oquendo
*Assistant Examiner* — Raul J Rios Russo
(74) *Attorney, Agent, or Firm* — Schiff Hardin LLP (57) ABSTRACT

In a method and magnetic resonance (MR) apparatus for determining time-dependent dephasing factors c of at least one fraction of a spectral component from at least two spectral components in an examination region in an examination object, the dephasing factors c are calculated directly from at least one first and one second record of MR data that have been recorded by operating an MR scanner of the apparatus with a multi-contrast sequence, using a system of equations that is based on a signal model and that describes the captured records of magnetic resonance data using parameters.

8 Claims, 4 Drawing Sheets

(56) References Cited

U.S. PATENT DOCUMENTS

| | | | |
|---|---|---|---|
| 2015/0061672 A1* | 3/2015 | Kannengiesser | A61B 5/055 324/309 |
| 2015/0161784 A1 | 6/2015 | Ma | |
| 2015/0331076 A1* | 11/2015 | Neji | G01R 33/4835 324/309 |
| 2015/0355306 A1* | 12/2015 | Stemmer | G01R 33/543 324/309 |
| 2016/0041247 A1* | 2/2016 | Feiweier | A61B 5/055 324/309 |
| 2016/0307334 A1* | 10/2016 | Dos Santos Mendonca | G06K 9/46 |
| 2016/0334482 A1* | 11/2016 | Kannengiesser | G01R 33/46 |

OTHER PUBLICATIONS

Hamilton et al: "In vivo Characterization of the liver fat 1H MR spectrum", NMR Biomed 2011, vol. 24, pp. 784-790; (2011).

Eggers et al., "Dual-Echo Dixon Imaging with Flexible Choice of Echo Times", Magnetic Resonance in Medicine, vol. 65, pp. 96-107, (2011).

Provencher,: "Estimation of Metabolite Concentrations from Localized in Vivo Proton NMR Spectra", in: Magnetic Resonance in Medicine, vol. 30, pp. 672-679; (1993).

\* cited by examiner

METHOD AND MAGNETIC RESONANCE APPARATUS FOR DETERMINING DEPHASING FACTORS IN MR MULTIECHO TECHNIQUES

BACKGROUND OF THE INVENTION

Field of the Invention

The invention concerns the determination of time-dependent dephasing factors of at least one spectral component from at least two spectral components in an examination region of an examination object by test measurements conducted with a magnetic resonance (MR) scanner, as well as a method for applying the dephasing factors that have been determined, and an MR apparatus and a non-transitory, computer-readable data storage medium for implementing such a method.

Description of the Prior Art

The magnetic resonance (MR) is a known modality by which it is possible to generate images of the inside of an examination object. Expressed in simple terms, for this purpose the examination object is positioned in a magnetic resonance scanner in a strong, static and homogenous basic magnetic field, also known as a $B_0$ field, having field strengths of 0.2 Tesla to 7 Tesla and more, such that the nuclear spins of the object are oriented along the basic magnetic field. Radio-frequency excitation pulses (RF pulses) are directed into the examination object in order to trigger nuclear spin resonances. The nuclear spin resonances that have been triggered are measured as so-called k-space data, and this is used as the basis for reconstructing MR images or calculating spectroscopic data. For spatially encoding the measured data, rapidly switched magnetic gradient fields are superimposed on the basic magnetic field. The measured data that have been recorded are digitized and stored as complex numerical values in a so-called k-space matrix. An associated MR image can be reconstructed from the k-space matrix containing the values, e.g. by a multidimensional Fourier transformation.

In the context of MR measurements of nuclear spins, it is possible to separate fractions of different spectral components contained in the MR data. The spectral components represent different spin species, e.g. nuclear spins in a fat environment and a water environment, or even in a silicone environment. For this purpose, chemical-shift imaging multiecho MR measurement sequences are often used in the context of Dixon techniques. Such techniques typically make use of the effect that the resonance frequency of nuclear spins depends on the molecular and/or chemical environment. This effect is known as chemical shift. Different spin species therefore have different resonance frequencies which make up the measured spectrum of the MR data. For example, the difference between two resonance frequencies of different spectral components can be expressed in ppm (parts per million, i.e. $10^{-6}$).

Many chemical species (e.g. water) have mono-frequency MR spectra, while others (e.g. fat) have a non-monofrequency MR spectrum. Others consist of multiple coupled resonances which have a known amplitude ratio, a known phase position (if applicable), and known frequency differences. This prior knowledge can be utilized when determining the overall signal of these species, see e.g. Provencher et al. "SW. Estimation of metabolite concentrations from localized in vivo proton NMR spectra" MRM 30: 672 (1993).

The MR signal from hydrogen nuclear spins in water is often considered to be a first fraction of the spectral component "water", and from hydrogen nuclear spins in fatty acid chains to be a second fraction of the second spectral component "fat". It is also possible in principle to examine further fractions of further spectral components. In the cited standard case, MR data can be used to determine a water MR image and a fat MR image, i.e. individual MR images of the two spectral components, respectively. This is relevant for a wide variety of clinical and/or medical applications.

In order to be able to separate the fractions of the various spectral components from each other, MR signals are captured at a number of echo times in the context of the Dixon technique. These MR signals together form the MR data. These different spectral components have different phase positions and amplitudes at the different echo times. Taking this effect into consideration, it is possible to determine the quantities of the chemical species separately.

A signal model that associates the measured or captured MR data with different physically relevant variables is generally used for this purpose. The different variables of the model represent the various fractions to be determined with respect to the spectral components, the spectra thereof and, depending on the accuracy, scope and complexity of the signal model, further unknowns of the measuring system. It is then possible for the fractions of the spectral components included in the signal model to be determined for each voxel of the MR data.

For example, the spectral model for fat as a spectral component is disclosed in Hamilton G. et al. "In vivo characterization of the liver fat $^1$H MR spectrum" NMR Biomed. 24: 784-790 (2011).

The results may vary according to the selected spectral model, however, since different assumptions are made in respect of the nature of the underlying spectrum of the fat in each case, and the fat which is actually present in the examination object may also be formed very differently depending on the examination object.

According to the procedure described by Hamilton et al., the fat spectra can be calibrated individually and then used as part of the signal model for Dixon techniques. However, this requires a considerable amount of time and a high degree of expertise and experience. Moreover, in the case of Dixon techniques using few echo times, the fat spectrum is only evaluated for correspondingly few complex-valued dephasing factors (phase position and amplitude) in the time window, and it is meanwhile possible to apply not only pure Dixon techniques using not only pure in-phase and opposed-phase contrasts.

DE102013217650A1 describes a method in which the dephasing factors are assumed to be known and the phase errors in magnetic resonance data records that were recorded by means of multi-contrast measurements are estimated.

SUMMARY OF THE INVENTION

An object of the present invention is to allow the different dephasing factors of the different spectral components in an examination region of an examination object to be determined at different echo times more easily and in a manner that is adapted to the examination object, in particular without having to make possibly incorrect assumptions about the spectra of the different spectral components.

This object is achieved by a method according to the invention for determining time-dependent dephasing factors of at least one fraction of a spectral component from at least two spectral components in an examination region that has the following steps.

At least one first and one second record of magnetic resonance data are acquired by operating an MR scanner with a multi-contrast sequence, wherein each record of the at least two records of magnetic resonance data is captured at an echo time associated with the respective record from at least two echo times in the multi-contrast sequence.

A system of equations is established in a computer on the basis of a signal model, this system of equations describing the captured records of magnetic resonance data using parameters, wherein the parameters include the fractions of the at least two spectral components in the magnetic resonance data, phase values belonging to the relevant echo times, and dephasing factors of at least one of the at least two spectral components.

In the computer, the solution space of the established system of equations is determined.

The computer also determines the dephasing factors of the at least one spectral component on the basis of the determined solution space and previously defined uniqueness requirements, and generates electrical signals representing these dephasing factors. The electrical signals are made available from the computer for storage or further use.

In this way, it is possible directly to determine the dephasing factors c from the captured magnetic resonance data records using only a system of equations which has been established on the basis of a signal model and describes the captured records of magnetic resonance data using parameters. By virtue of the resulting auto-calibration of the determined dephasing factors with reference to the at least two records of recorded magnetic resonance data, it is possible to optimize a separation of different spectral components in MR images of an examination object, e.g. a water-fat separation.

The method therefore allows automatic separation of different spectral components, in particular fat and water, or also suppression of a spectral component, e.g. the fat, on the basis of the magnetic resonance data records that have been created by the multi-contrast sequence, and avoids errors which can occur when using existing methods as a result of spectral models that are inadequate or inappropriate for the situation concerned.

For the purpose of determining the fractions of the spectral components, a method according to the invention for determining at least one first and one second fraction per spectral component in magnetic resonance data that have been captured by a multi-contrast sequence uses the magnetic resonance data has been captured and dephasing factors that have been determined by the method described above.

A magnetic resonance apparatus according to the invention has an MR scanner with a basic field magnet, a gradient coil arrangement, a radio-frequency antenna arrangement and a control computer that is designed to perform the method according to the invention, wherein the control computer has a dephasing determination processor designed to determine the dephasing factors using the described method.

The invention also encompasses a non-transitory, computer-readable data storage medium encoded with programming instructions that is loadable in a control and evaluation computer (or is distributed among respective processors of such a computer), and the programming instructions (program code) cause the computer to execute the method according to the invention as described above.

The advantages and observations cited in relation to the method apply analogously to the method for determining at least one first and one second spectral fraction in magnetic resonance data that have been captured by a multi-contrast sequence, to the magnetic resonance apparatus, and the electronically readable data medium.

DESCRIPTION OF THE PREFERRED EMBODIMENTS

Figure 1:
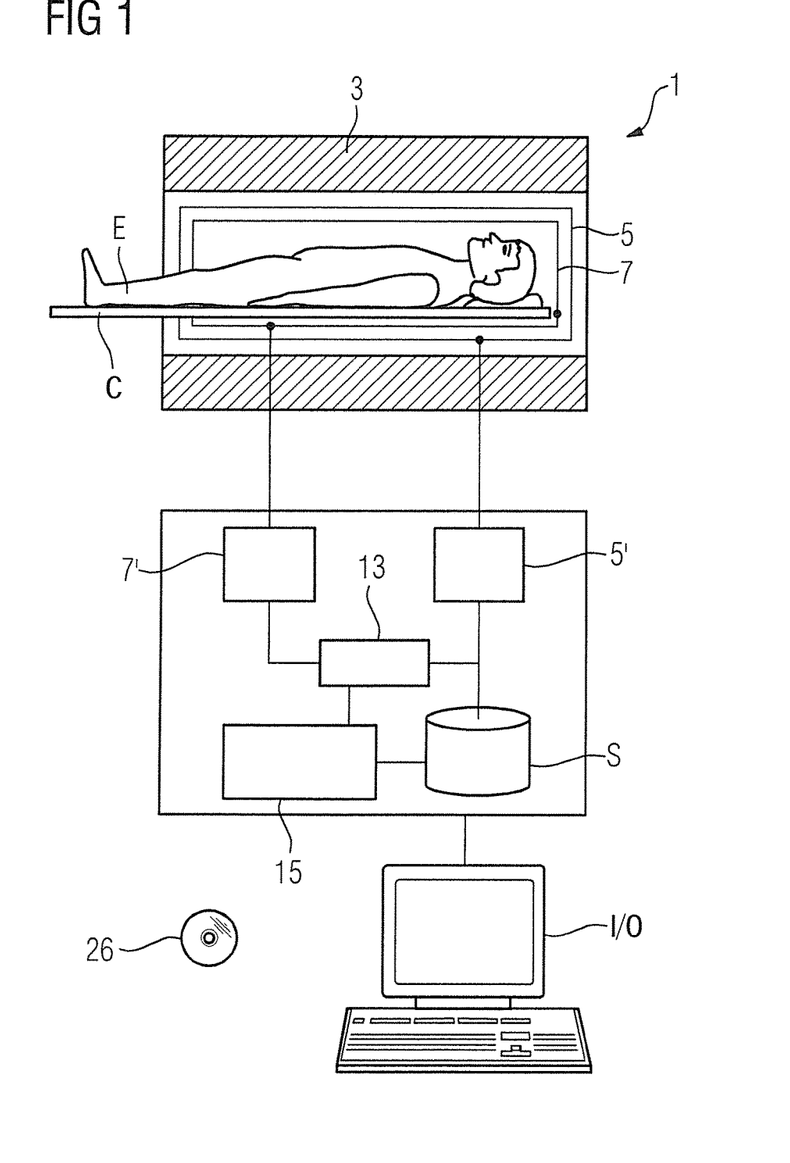
FIG. 1 is a schematic illustration of a magnetic resonance apparatus according to the invention.

FIG. 1 schematically illustrates a magnetic resonance apparatus 1 according to the invention. This has a scanner 3 that has a basic field magnet for generating the basic magnetic field, a gradient coil arrangement 5 for generating the gradient fields, a radio-frequency antenna arrangement 7 for applying and receiving radio-frequency signals, and a control computer 9 designed to perform the method according to the invention. These components of the magnetic resonance apparatus 1 are illustrated in a simple schematic manner in FIG. 1. For example, the radio-frequency arrangement 7 may have multiple subunits, such as multiple coils, which may be configured solely to radiate radio-frequency signals, solely to receive the radio-frequency signals that have been triggered, or both.

In order to examine an examination object E, e.g. a patient or a phantom, this can be introduced into the measuring volume of the magnetic resonance scanner 3 on a couch C.

The control computer 9 is used to control the scanner 3, in particular to control the gradient coil arrangement 5 by a gradient controller 5' and the radio-frequency arrangement 7 by a radio-frequency transmit/receive controller 7'. The control computer 9 further has a dephasing determination processor 15, with which the control computer 9 performs the steps that are required for the method according to the invention for determining dephasing factors (cf. FIG. 2). The control computer 9 has a CPU 13 designed to execute all of the computing operations that are necessary for the measurements and determinations required. Results or intermediate results that are required for this purpose or determined in this context can be stored in a memory M of the control computer 9. The units represented here should not necessarily be understood as physically separate units, but merely represent a breakdown into logical units that can nonetheless also be realized in fewer units or even as a single physical unit.

An input/output device I/O of the magnetic resonance apparatus 1 is by an operator to send control instructions to the magnetic resonance apparatus 1 and/or to display results from the control computer 9, including image data or the dephasing factors that have been determined, for example.

The methods described herein may also be provided singly or separately in the form of a computer program which the respective method implements on a control device 9 when it is executed on the control computer 9. An electronically readable data medium 26 is provided, storing electronically readable control information that represents at least one such computer program as described above and is configured so as to perform the described method or methods when the data medium 26 is used in the control computer 9 of a magnetic resonance apparatus 1.

Figure 2:
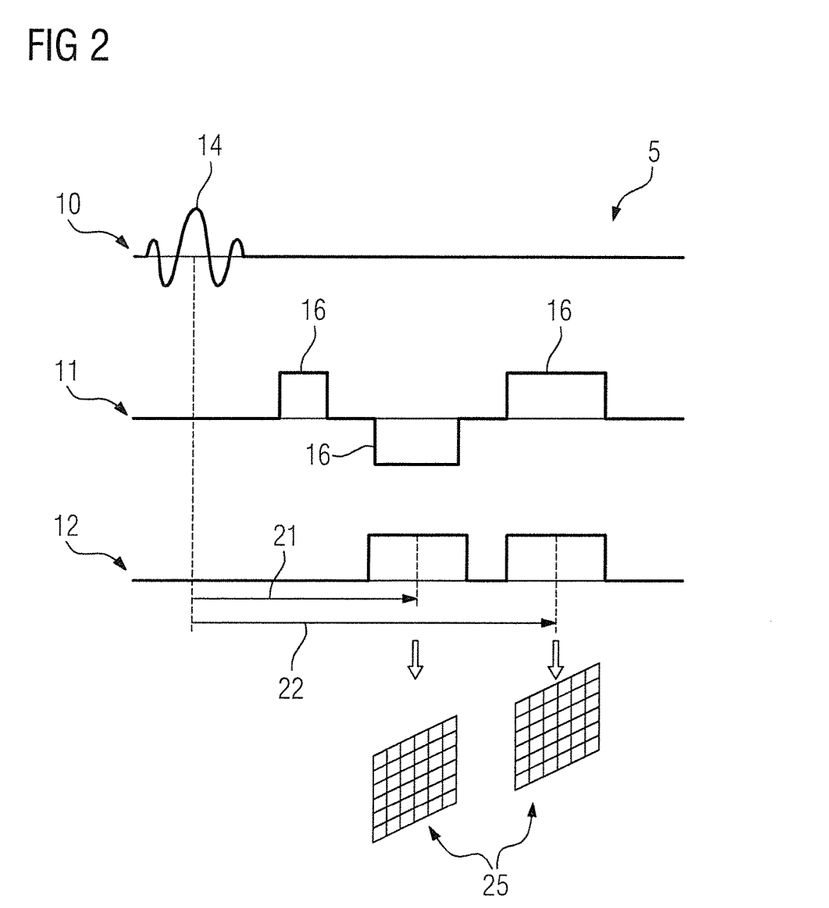
FIG. 2 shows an exemplary multi-contrast sequence, as can be used in the method according to the invention.

FIG. 2 shows an exemplary two-point Dixon MR measurement sequence as a multi-contrast sequence 5. It shows a high-frequency component 10, a gradient field component 11 and a readout channel 12. An RF excitation pulse 14 is applied first. Readout gradient fields 16 are then connected, forming two gradient echoes at the first echo time 21 and the second echo time 22. The MR data 25, specifically an MR signal for each echo time 21, 22, are received as a result of the analog-to-digital conversion, graphically indicated by the measurement blocks on the readout channel 12. The first and second echo times 21, 22 are defined in relation to the so-called iso-delay time point of the RF excitation pulse 15, which is situated e.g. at approximately the midpoint of the RF excitation pulse with a SINC amplitude envelope. Other definitions of the first and second echo time 21, 22 are possible and need not be discussed in greater detail in this context.

FIG. 2 is a simplified representation since at least one layer selection gradient field and one phase encoding gradient field, which are typically required for complete spatial encoding of a voxel of the MR data 25, are not shown. The MR data 25 is however received in a resolution for various voxels (as illustrated by the grid in FIG. 2), such that the further gradient fields are also typically used for the spatial encoding.

While FIG. 2 shows a gradient-echo MR measurement sequence, other two-point Dixon MR measurement sequences can also be used. For example, a spin-echo MR measurement sequence or a monopolar gradient-echo MR measurement sequence may be used. Moreover, instead of a two-point Dixon sequence, it is also possible to use multi-point Dixon sequences such as e.g. a three-point Dixon sequence for the method according to the invention. In this case, more than only two records of magnetic resonance data are received accordingly, having been recorded at the respectively more than only two echo times.

When using such multi-contrast sequences, such as the cited Dixon sequences, the echo times are selected such that a specific phase position of the different spectral components is present at the different echo times in each case, e.g. in the case of a two-point Dixon sequence the same phase of the spectral components (in-phase) is conventionally present at one of the two echo times, and the respectively opposite phase positions of the spectral components (opposed-phase) is present at the other echo time. The respective specific phase positions of the spectral components are taken into account in the signal model accordingly (see equation (1)).

Figure 3:
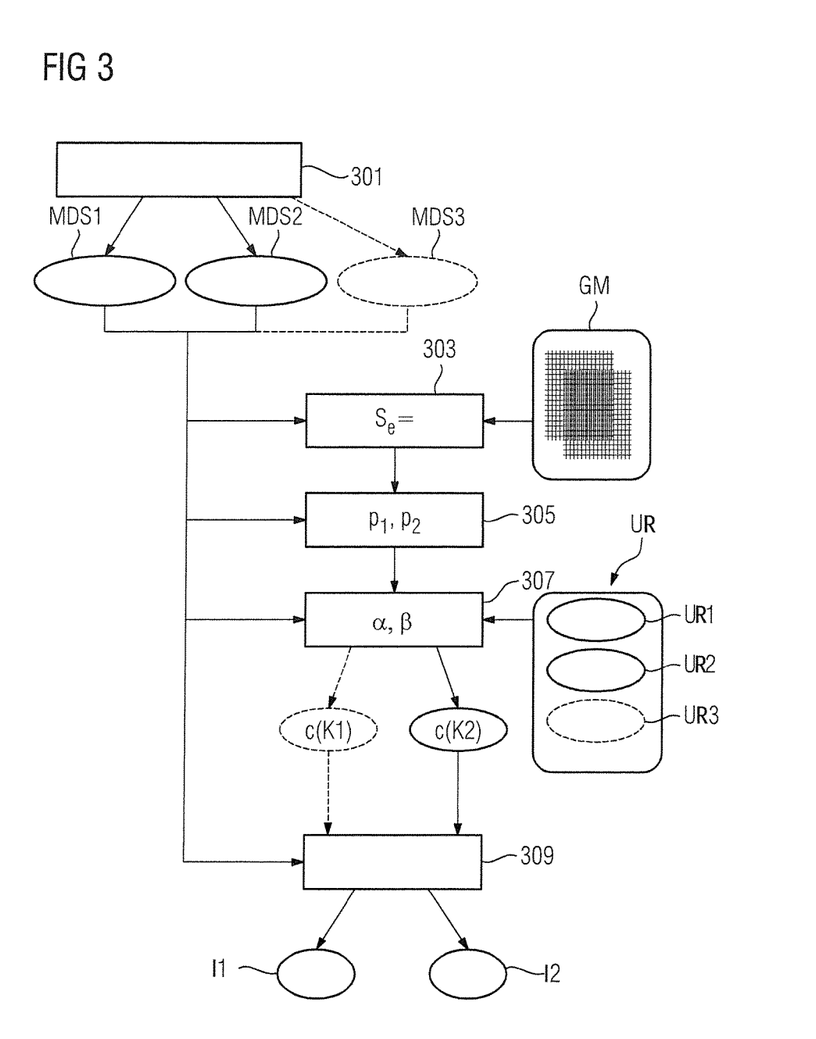
FIG. 3 is a flowchart of the method according to the invention.

FIG. 3 is a flowchart that illustrates the method according to the invention.

In the method for determining time-dependent dephasing factors c of at least one fraction of one from at least two spectral components K1, K2 in an examination region of an examination object E, provision is first made in a step 301 for capturing at least one first record of magnetic resonance data MDS1 and one second record of magnetic resonance data MDS2 by a multi-contrast sequence, wherein each record of the at least two records of magnetic resonance data MDS1, MDS2, MDS3 is captured at an echo time associated with the respective record from at least two echo times in the multi-contrast sequence.

As described above with reference to FIG. 2, the number of records of magnetic resonance data MDS1, MDS2, MDS3 that are captured depends on the multi-contrast sequence that has been selected. In the case of a two-point Dixon sequence, one record of magnetic resonance data MDS1, MDS2 is captured at each of two different echo times, while in the case of a three-point Dixon sequence, one record of magnetic resonance data MDS1, MDS2, MDS3 is captured at each of three different echo times, and so on. It is also possible for more than three records of magnetic resonance data to be captured in this context (not shown).

In a further step 303, a system of equations is created on the basis of a signal model, and describes the captured records of magnetic resonance data MDS1, MDS2, MDS3 using parameters. The following equation is an example of a signal model, and describes the signal $S_e(x)$ at the voxel x and at the echo time e:

$$S_e(x)=(K1(x)+c_e K2(x))e^{i\Phi_e(x)}, \quad (1)$$

where $K1(x)$ and $K2(x)$ represent the fractions of the (in this case) two spectral components, where e.g. $K1(x)$ can represent the water component and $K2(x)$ the fat component. $\Phi_e(x)$ describes an unknown phase evolution and $c_e$ describes the dephasing factors that are sought for the second spectral component $K2(x)$ in this case. This means that the parameters describing the signal, and therefore describing the captured records of magnetic resonance data, comprise the fractions of the at least two spectral components K1 and K2 of the magnetic resonance data, phase values De(x) associated with the relevant echo times, and dephasing factors $c_e$ of at least one of the at least two spectral components K1 and K2.

It should be noted in the cited example that two complex numerical values $S_1(x)$ and $S_2(x)$ and four real numbers $K1(x)$, $K2(x)$, $\Phi_1(x)$ and $\Phi_2(x)$ are opposed to each other for each voxel x. Therefore no information about $c_e$ can be obtained from the equation (1) if it is processed voxel-by-voxel, since the system of equations is underdetermined. Even if the magnitude of the measured magnetic resonance data is fitted to the magnitude of the signal model as per the prior art, it is not possible to obtain any information about $c_e$ since all of the parameters are defined in this case.

If more than two records of magnetic resonance data MDS1, MDS2, MDS3 are captured, the number of variables that are characterized by the index e increases correspondingly. In the case of three captured records of magnetic resonance data MDS1, MDS2, MDS3, for example, three complex numbers $S_1(x)$, $S_2(x)$ and $S_3(x)$ and five real numbers $K1(x)$, $K2(x)$, $\Phi_1(x)$, $\Phi_2(x)$ and $\Phi_3(x)$ are obtained for each voxel, thereby already allowing a degree of freedom in respect of information about $c_e$. It applies generally that one complex signal value $S_e$ is received for each echo time e, and therefore $2 \times N_e$ equations in the system of equations (corresponds to dimension of the vectors $p_e$, see below), where $N_e$ is the number of echo times and hence the number of records of magnetic resonance data.

If more than two different spectral components K1, K2 are observed, similar considerations apply. The same applies if dephasing factors are to be determined for more than just one spectral component K1, K2, e.g. $c_{K1;e}$ and $c_{K2;e}$.

If the system of equations is underdetermined for a given number of captured records of magnetic resonance data and desired dephasing factors, a generalization matrix GM having a lower resolution than the captured magnetic resonance data can be determined for at least one of the cited parameters of the system of equations, wherein the parameter is assumed to be constant at a matrix point of said generalization matrix. Examples of generalization matrices GM are given below with reference to FIGS. 4 and 5.

Figure 4:
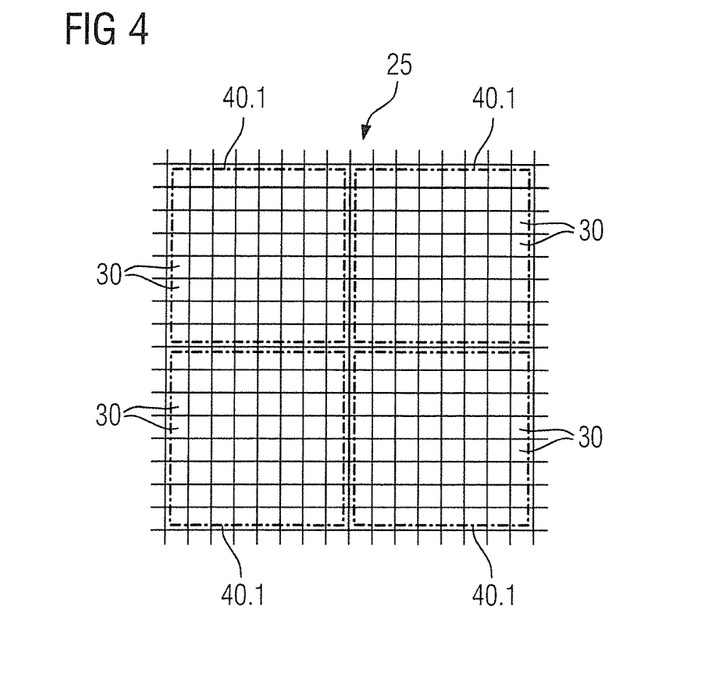
FIGS. 4 and 5 schematically show voxels of the magnetic resonance data with various generalization matrices.
Figure 5:
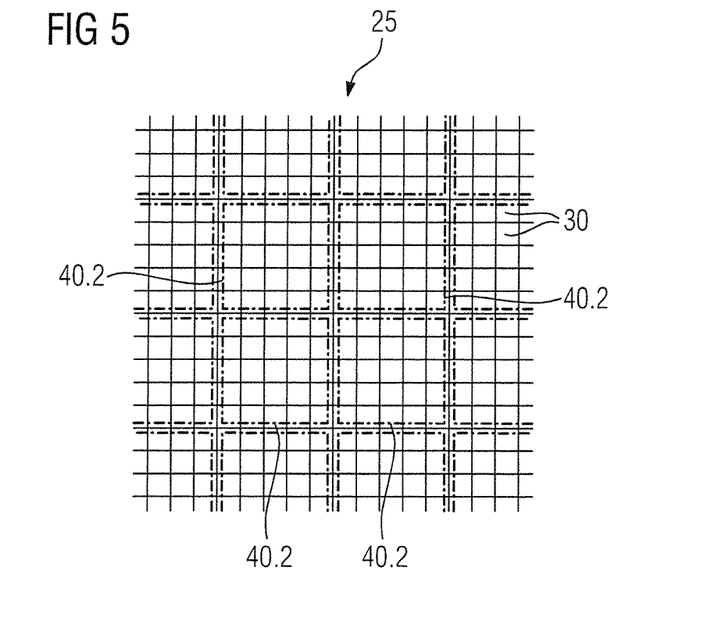

Such an approach is based on an assumption which is made in the context of most Dixon methods, specifically on the assumption that e.g. the phase components, in particular the phase difference $\Phi_1(x)-\Phi_2(x)$, only change slowly spatially. This is normally used in "phase unwrapping" methods, which are required for correct solution of a fitted signal model. As explained in a different context in DE102013217650A1, for example, this allows the use of a multi-resolution approach in which e.g. the phase $\Phi_e(x)$ is assumed to be constant in larger regions of the recorded magnetic resonance data record, and hence at matrix points 40.1, 40.2 of a generalization matrix GM. As a result, the system of equations is no longer underdetermined, since e.g. two real numbers $K1(x)$ and $K2(x)$ must now be fitted to two complex numbers $S1(x)$ and $S2(x)$ at each voxel and the phases $\Phi_1(x)$, $\Phi_2(x)$ are effectively constant at the matrix points 40.1, 40.2 of the generalization matrix GM. By virtue of the degree of freedom achieved thus, it is possible to optimize parts of the spectral model, e.g. the dephasing factors $c_e$.

In addition to the phase, one or more further parameters (with the exception of the dephasing factors c) can also be assumed to be constant at a matrix point 40.1, 40.2 of a generalization matrix GM. In this context, it is possible to assume in particular that a first parameter is constant at matrix points of a first generalization matrix and a second parameter is constant at matrix points of a second generalization matrix, wherein the respective resolutions of the first and the second generalization matrix may still differ, but are lower than the resolution of the voxels of the records of magnetic resonance data. For example, at least one of the fractions of a spectral component $K1(x)$ or $K2(x)$ can also be assumed to be constant at matrix points 40.1, 40.2 of a generalization matrix GM. The examination object E that is to be examined and the governing conditions largely dictate which parameters on a generalization matrix can be assumed to be constant and at which resolution.

The example introduced above in equation (1) of capturing two records of magnetic resonance data, e.g. by means of a two-point Dixon measurement, and determining the dephasing factors $c_e$ for the fraction of the spectral component $K2(x)$, is continued in the equations below. The following equations can be adapted in a similar manner for other multiecho Dixon methods or other spectral components.

As described in greater detail in DE102013217650A1 cited above, it is possible by means of the complex-valued system of equations and by algebraic evaluations of the same, in particular by a so-called variable projection, to fit the signal model to the captured records of magnetic resonance data, thereby determining a solution space of the system of equations. This applies because, according to the cited transformations, the dephasing factors c only occur as a result of a projector in a real four-dimensional Euclidian space, which projects onto a two-dimensional subspace that is spanned by the vectors $(1,0,1,0)^T$ and $(Re(c1),Im(c1),Re(c2),Im(c2))^T$. (The subspace corresponds to the space that is spanned by the columns $(A_R, A_I)^T$ in the cited DE102013217650A1.)

A natural orthogonal basis for the projected subspace is then:

$$p_1 = 1/\sqrt{2}(1,0,1,0)^T, \qquad (2)$$

$$p_2 = u/\|u\|, \qquad (3)$$

where $$u = (\tfrac{1}{2}(Re(c_1)-Re(c_2)), Im(c_1), -\tfrac{1}{2}(Re(c_1)-Re(c_2)), Im(c_2))^T. \qquad (4)$$

In this way, the solution space of the established system of equations can be determined in a step 305.

It is also possible here to determine a result vector $p_2$ as an optimized vector $p_2$ for the whole record of magnetic resonance data, specifically by optimizing the consistency of the captured magnetic resonance data using the signal model. Since $p_2$ is orthogonal relative to $p_1$ and is normalized to one, $p_2$ can be parameterized by the equation:

$$p_2 = \left(\frac{1}{\sqrt{2}}\cos\theta,\ \sin\theta\sin\varphi,\ -\frac{1}{\sqrt{2}}\cos\theta,\ \sin\theta\cos\varphi\right)^T, \qquad (5)$$

which corresponds to angular coordinates of a two-dimensional sphere. The determination of the solution space therefore includes voxel-based fitting of the signal model to the corresponding captured magnetic resonance data.

If $p_2$ is determined by means of optimization (fitting) in this way, it is nonetheless still only possible to state that the dephasing vectors $c_e$ lie "somewhere" in the space that is spanned by the vectors $p_1$ and $p_2$, the solution space.

It therefore applies that:

$$(Re(c_1), Im(c_1), Re(c_2), Im(c_2))^T = \beta(\alpha p_1 + p_2). \qquad (6)$$

In this context, the normalization factor $\beta$ serves merely as a scaling factor for $K2(x)$ (according to equation (1) and is otherwise not significant for the determination of the dephasing factors. In particular, if $K2(x)$ is equal to the fat fraction and $K1(x)$ is equal to the water fraction, the above statement is correct, since it is then often the case that only the water component is in focus. For the sake of simplicity, we will therefore select $\beta=1$ initially and refine this factor later if appropriate.

The shift $\alpha$ is however also relevant for the fraction of the spectral component $K1(x)$. In order to determine $\alpha$, the effect of a change in the shift $\alpha \rightarrow \alpha + \delta\alpha$ is illustrated first:

The received fractions of the spectral components $K1(x)$ and $K2(x)$ then change as follows:

$$K1(x) \rightarrow K1(x) - \delta\alpha K2(x),$$

$$K2(x) \rightarrow K2(x).$$

Meaning that: the received fraction of the spectral component $K2(x)$ is not influenced by such a change in the shift, whereas the fraction of the spectral component $K1(x)$ is shifted by a term which is proportional to $K2(x)$.

With reference to this knowledge from the signal model and with further reference to uniqueness requirements UR based on the solution space, the dephasing factors of the at least one spectral component can now be optimally determined and e.g. stored in a step 307.

For example, uniqueness requirements UR1 may take the form of a rule which restricts the solution space in such a way that the dephasing factors determined on the basis thereof are compatible with a known spectral model of at least one of the spectral components K1, K2.

For example, if K1 is the water component, it is known from the spectral model for water that the fraction $K1(x) = W(x)$ is always positive, and that there are also voxels x which are not dominated by water K1 but by the second spectral component K2, e.g. the fat component. This allows the shift $\alpha$ to be determined.

It can be helpful here to consider a variable which specifies the relative fraction of a spectral component to the sum of all fractions of all spectral components:

$$\frac{K2(x)}{K1(x) + K2(x)}.$$

In the case of the fat component, for example, the so-called fat fraction behaves as follows in response to the shift cited above:

$$\frac{F(x)}{W(x) + F(x)} \rightarrow \frac{F(x)}{W(x) + (1 - \delta\alpha)F(x)}.$$

In order now to determine α, e.g. a histogram of the relative fraction can be calculated, applying threshold values for the intensities if necessary in order to eliminate outliers. The largest value of the relative fraction in the histogram can now be set equal to 1−δα in order to define α. The relative fraction of the spectral component whose dephasing factors are determined therefore reaches a maximal value of 100%.

Now that α is known, the fraction of the spectral component whose dephasing factors are to be determined can be further adjusted by the previously mentioned scaling factor β. It is also possible in particular to refer again to known properties of the spectral components, e.g. from known spectral models.

For example, on the basis of the single-peak spectral model, β can be selected such that the norm of the vector $p_2$ corresponds to the root of two, $\sqrt{2}$. As mentioned above, in the case of a water-fat observation, the factor β has no significance in relation to a water image that has been calculated using the received dephasing factors.

While it appears natural to assume constant dephasing factors c in the overall measured volume, this is however not necessarily the case. The proposed method also allows spatially slowly changing dephasing factors to be assumed and calculated. For this purpose, for example, the dephasing factors to be determined can be assumed to be constant only at matrix points of a generalization matrix, and the dephasing factors for such matrix points can be determined in a similar manner to that explained above.

Therefore the uniqueness requirements UR1 can be defined on the basis of a spectral model of at least one of the spectral components, and therefore be based on known properties of the at least one spectral component. In addition or alternatively, uniqueness requirements UR2 can be defined on the basis of mathematical conditions which reflect the real ratios of the fractions of the spectral components. In addition or alternatively, further uniqueness requirements UR3 may be used depending on the specific situation, e.g. examination object.

The dephasing factors c of the at least one component K1, K2 are therefore obtained as a result of step 307. If more than two spectral components are observed, the dephasing factors of all observed spectral components can also be calculated in a similar manner.

It is therefore possible to determine, for each voxel, one first and one second fraction per spectral component in magnetic resonance data (25) which has been captured by means of a multi-contrast sequence.

In a further step 309, using the captured magnetic resonance data (25) and dephasing factors that have been determined by means of the method described above, it is possible if applicable to determine at least one image data record I1, I2, in which (respectively) only one of the spectral components of the examination object is depicted. It is thereby possible to produce a purely water image and/or a purely fat image, for example.

As an example, FIGS. 4 and 5 show voxels 30 of the magnetic resonance data and different generalization matrices having matrix points 40.1 and 40.2. The matrix points 40.1 and 40.2 of a generalization matrix are represented by dash-dot lines in each case. Furthermore, the voxels 30 of the magnetic resonance data 25 are represented in FIGS. 4 and 5 by means of continuous lines. It can be seen from FIGS. 4 and 5 that the generalization matrix is so determined as to have a lower resolution than the magnetic resonance data 25, i.e. a matrix point 40.1 or 40.2 is larger than a voxel 30 in each case. Each matrix point 40.1 and 40.2 comprises a predetermined number of adjacent voxels 30 of the magnetic resonance data 25. In the case of FIG. 4, a matrix point 40.1 comprises 8×8=64 voxels 30 in square matrix points 40.1. In the case of FIG. 5, there are 5×5=25 voxels 30 in each case, again in square matrix points 40.2. The generalization matrix in FIG. 5 therefore has a higher resolution that the generalization matrix in FIG. 4. The exact number of adjacent voxels 30 of magnetic resonance data 25 that are encompassed by a matrix point 40.1 or 40.2 may be defined here as a function of a user input and/or a machine parameter of the magnetic resonance installation 1, for example. It is also theoretically possible for the generalization matrices used here to include matrix points 40.1 and 40.2 which are not square.

Initial results show that it is possible to achieve a significantly improved correspondence between the measured magnetic resonance data and the signal model when using the proposed method. For example, in the context of a two-point Dixon recording of the chest, it was possible to achieve a correspondence of e.g. 4.6% of the total intensity (L2 norm of the measured signal vector) in comparison with a correspondence of 9.2% when using the method according to DE102013217650A1.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining time-dependent dephasing factors of at least one fraction of a spectral component, among at least two spectral components, in a magnetic resonance examination region in an examination object, comprising:

operating a magnetic resonance data acquisition scanner, while an examination object is situated therein, to acquire at least a first record and a second record of magnetic resonance data from an examination region in the examination object, by executing a multi-contrast magnetic resonance data acquisition sequence that comprises at least two echo times, with each of said first and second records being individually acquired at an echo time, among said at least two echo times, respectively associated with that record;

providing said first and second records to a computer and, in said computer, automatically establishing a system of equations based on a signal model, said system of equations describing the acquired first and second records using parameters, said parameters comprising respective fractions of at least two spectral components in said first and second records, phase values belonging to the respective echo times, and dephasing factors of at least one of said at least two spectral components;

in said computer, automatically determining a solution space of said system of equations;

providing said computer with an input designating defined uniqueness requirements;

in said computer, determining said dephasing factors of at least one of said spectral components from said solution space and said uniqueness requirements; and in said computer, executing a reconstruction algorithm in order to use said dephasing factors of at least one of said spectral components to generate image data from at least one of said first and second records, said image data representing only one of said at least two spectral components, and displaying said image data at a display screen as a magnetic resonance image of the examination region in which only said one of said at least two spectral components is depicted.

2. A method as claimed in claim 1 wherein said signal model is comprised of voxels and said first and second records are each comprised of voxels, and wherein said determination of said solution space in said computer comprises voxel-based fitting of said signal model to corresponding voxels in said first and second records.

3. A method as claimed in claim 1 comprising designating said uniqueness requirement as at least one requirement selected from the group consisting of a requirement defined based on a spectral model of at least one of said spectral components, and a requirement based on at least one mathematical condition that represents real ratios of said spectral components.

4. A method as claimed in claim 1 wherein said system of equations is mathematically underdetermined when determining said solution space, and comprising determining, in said computer, at least one generalization matrix having a lower resolution than said first and second records, and in which at least one parameter of said system of equations is assumed to be constant at a matrix point of said generalization matrix.

5. A method as claimed in claim 4 wherein said generalization matrix is a first generalization matrix, and determining a second generalization matrix in said computer, and, in said computer, assuming a first parameter to be constant at matrix points of said first generalization matrix and assuming a second parameter to be constant at matrix points of said second generalization matrix.

6. A method as claimed in claim 5 comprising determining said first and second generalization matrices in said computer with respectively different resolutions.

7. A magnetic resonance apparatus comprising:
a magnetic resonance data acquisition scanner;
a control computer configured to operate the magnetic resonance data acquisition scanner, while an examination object is situated therein, to acquire at least a first record and a second record of magnetic resonance data from an examination region in the examination object, by executing a multi-contrast magnetic resonance data acquisition sequence that comprises at least two echo times, with each of said first and second records being individually acquired at an echo time, among said at least two echo times, respectively associated with that record;
an evaluation computer provided with said first and second records, said computer being configured to automatically establish a system of equations based on a signal model, said system of equations describing the acquired first and second records using parameters, said parameters comprising respective fractions of at least two spectral components in said first and second records, phase values belonging to the respective echo times, and dephasing factors of at least one of said at least two spectral components;
said evaluation computer being configured to automatically determine a solution space of said system of equations;
said evaluation computer being provided with an input designating defined uniqueness requirements;
said evaluation computer being configured to determine said dephasing factors of at least one of said spectral components from said solution space and said uniqueness requirements; and
execute a reconstruction algorithm in order to use said dephasing factors of at least one of said spectral components to generate image data from at least one of said first and second records, said image data representing only one of said at least two spectral components, and to display said image data at a display screen as a magnetic resonance image of the examination region in which only said one of said at least two spectral components is depicted.

8. A non-transitory, computer-readable data storage medium embodying programming instructions, said storage medium being loaded into a control and evaluation computer of a magnetic resonance apparatus, that comprises a magnetic resonance data acquisition scanner, said programming instructions causing said control and evaluation computer to:
operate the magnetic resonance data acquisition scanner, while an examination object is situated therein, to acquire at least a first record and a second record of magnetic resonance data from an examination region in the examination object, by executing a multi-contrast magnetic resonance data acquisition sequence that comprises at least two echo times, with each of said first and second records being individually acquired at an echo time, among said at least two echo times, respectively associated with that record;
automatically establish a system of equations based on a signal model, said system of equations describing the acquired first and second records using parameters, said parameters comprising respective fractions of at least two spectral components in said first and second records, phase values belonging to the respective echo times, and dephasing factors of at least one of said at least two spectral components;
automatically determine a solution space of said system of equations;
receive an input designating defined uniqueness requirements;
determine said dephasing factors of at least one of said spectral components from said solution space and said uniqueness requirements; and
execute a reconstruction algorithm in order to use said dephasing factors of at least one of said spectral components to generate image data from at least one of said first and second records, said image data representing only one of said at least two spectral components, and display said image data at a display screen as a magnetic resonance image of the examination region in which only said one of said at least two spectral components is depicted.

\* \* \* \* \*